(12) United States Patent
Asahata et al.

(10) Patent No.: US 9,269,539 B2
(45) Date of Patent: Feb. 23, 2016

(54) FOCUSED ION BEAM APPARATUS (71) Applicant: HITACHI HIGH-TECH SCIENCE CORPORATION, Minato-ku, Tokyo (JP)

(72) Inventors: Tatsuya Asahata, Tokyo (JP); Hidekazu Suzuki, Tokyo (JP); Makoto Sato, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 14/665,410

(22) Filed: Mar. 23, 2015

(65) Prior Publication Data

US 2015/0270102 A1 Sep. 24, 2015

(30) Foreign Application Priority Data

Mar. 24, 2014 (JP) ................................. 2014-060001

(51) Int. Cl.

| *H01J 37/00* | (2006.01) |
|---|---|
| *H01J 37/317* | (2006.01) |
| *H01J 37/244* | (2006.01) |
| *H01J 37/22* | (2006.01) |

(52) U.S. Cl.
CPC ............. *H01J 37/317* (2013.01); *H01J 37/222* (2013.01); *H01J 37/244* (2013.01); *H01J 2237/2448* (2013.01); *H01J 2237/31749* (2013.01)

(58) Field of Classification Search
CPC ..... H01J 37/317; H01J 37/244; H01J 37/222; H01J 2237/31749; H01J 2237/2448
USPC ............ 250/306, 307, 310, 311, 492.1–492.3
See application file for complete search history.

(56) References Cited

U.S. PATENT DOCUMENTS

| 8,637,819 B2* | 1/2014 | Sato ....................... H01J 37/261 250/306 |
|---|---|---|
| 2009/0020698 A1* | 1/2009 | Muto ....................... G01N 1/32 250/310 |

FOREIGN PATENT DOCUMENTS

JP 20102308 1/2010

* cited by examiner

*Primary Examiner* — Michael Maskell
(74) *Attorney, Agent, or Firm* — Adams & Wilks (57) ABSTRACT

A focused ion beam apparatus includes: a focused ion beam tube configured to irradiate a focused ion beam onto a sample; a detector configured to detect secondary particles generated from the sample due to the irradiation and to output detection information regarding detected secondary particles; an image forming unit configured to form an observation image of the sample based on the detection information; a storage unit configured to store positional relation between a first processing area set on an observation image of a first sample and a cross-section surface of the first sample; and a processing area setting unit configured to automatically set a second processing area on an observation image of a second sample based on the positional relation stored in the storage unit and a position of a cross-section surface of the second sample on the observation image of the second sample.

6 Claims, 11 Drawing Sheets

FOCUSED ION BEAM APPARATUS

CROSS-REFERENCE TO RELATED APPLICATION

This application claims priority from Japanese Patent Application No. 2014-060001, filed on Mar. 24, 2014, the entire subject matter of which is incorporated herein by reference.

BACKGROUND

1. Technical Field

The present invention relates to a focused ion beam apparatus.

2. Description of the Related Art

In the related art, TEM observation at specific positions is being widely used to set process conditions and perform process management with respect to semiconductor devices. In order to manufacture these sample pieces for TEM observation, an FIB-SEM apparatus is used (see, for example, JP-A-2010-002308). Also, in recent years, miniaturization of device structures has developed, and the film thicknesses of TEM samples to be manufactured have decreased. For example, in current NAND flash memories, it is required to decrease their thicknesses to 20 nm or less.

However, in order to manufacture TEM samples having smaller film thicknesses, a high technical level is required. Also, since it is required for a plurality of workers having different technical levels to manufacture a number of samples, a reduction in a technical level which is required of workers, the uniformity in the quality of manufactured TEM samples, and shortening of work time are big issues.

SUMMARY

The present invention has been made in view of the above-described circumstances, and one of objects of the present invention is to provide a focused ion beam apparatus capable of manufacturing samples having uniform quality by an easier operation.

According to an exemplary embodiment of the present invention, there is provided a focused ion beam apparatus including: a focused ion beam tube configured to irradiate a focused ion beam onto a sample; a detector configured to detect secondary particles generated from the sample due to the irradiation with the focused ion beam and to output detection information regarding detected secondary particles; an image forming unit configured to form an observation image of the sample based on the detection information; a storage unit configured to store positional relation between a first processing area set on an observation image of a first sample and a cross-section surface of the first sample; and a processing area setting unit configured to automatically set a second processing area on an observation image of a second sample based on the positional relation stored in the storage unit and a position of a cross-section surface of the second sample on the observation image of the second sample.

BRIEF DESCRIPTION OF THE DRAWINGS

The above and other aspects of the present invention will become more apparent and more readily appreciated from the following description of illustrative embodiments of the present invention taken in conjunction with the attached drawings, in which.

DETAILED DESCRIPTION

Figure 1:
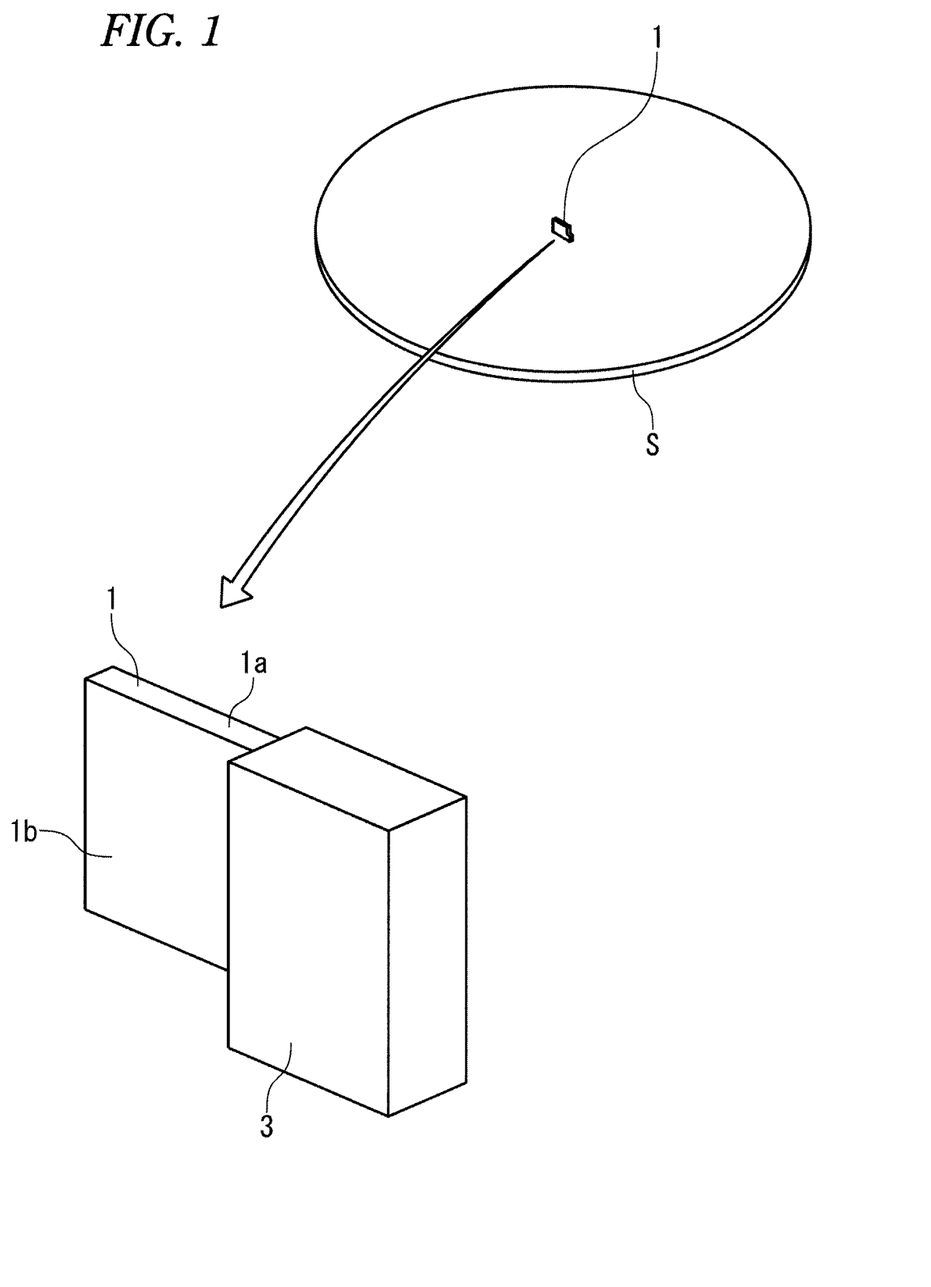
FIG. 1 is a schematic diagram for explaining a thin-sample manufacturing method according to an embodiment of the present invention.
Figure 2:
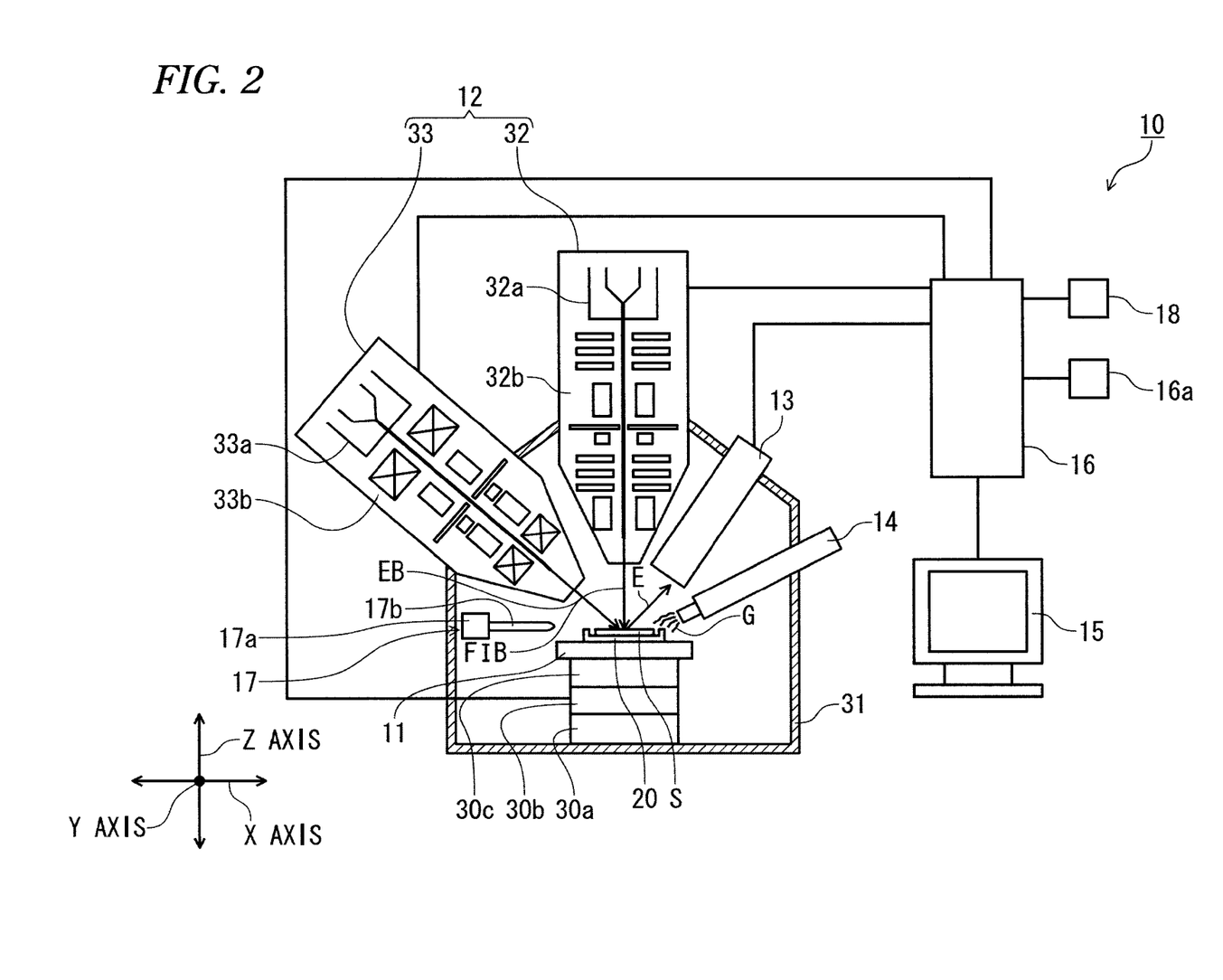
FIG. 2 is a configuration diagram illustrating a configuration of a focused ion beam apparatus according to the embodiment.

Hereinafter, an embodiment of the present invention will be described with reference to the accompanying drawings. A thin-sample manufacturing method of the present embodiment is a method of taking a thin sample 1 out of a sample S such as a wafer having semiconductor devices formed thereon, and fixing the corresponding thin sample 1 on a side wall of a sample holder 3 using a deposition film, and performing thinning of the thin sample 1 as shown in FIG. 1. Since the thin sample 1 is fixed to the side wall, it is possible to prevent an irradiation beam from hitting any other component during thinning whereby a sputtered material attaches to the thin sample 1. Also, in the present embodiment, a case of manufacturing thin samples 1 for TEM observation by a double beam type focused ion beam apparatus 10 capable to radiating two beams of a focused ion beam FIB and an electron beam EB as shown in FIG. 2 will be described as an example. Also, a case where a sample S and the sample holders 3 are disposed on the same stage 11 will be described as an example. In the example shown in the drawings, a surface and cross-section surface of each thin sample 1 are denoted by reference symbols "1a" and "1b", respectively.

First, the focused ion beam apparatus 10 will be described.

The focused ion beam apparatus 10 is provided with the stage 11 where a sample S and the sample holders 3 are mounted, an irradiation mechanism 12 which irradiates a focused ion beam FIB and an electron beam EB, a detector 13 which detects secondary charged particles E generated by irradiation with the focused ion beam FIB or the electron beam EB, a gas gun 14 which supplies a source gas G for forming deposition films, a controller 16 (an image forming unit, a processing area setting unit, and an image processing unit) which generates image data based on the detected secondary charged particles E, and controls a display 15 such that the display 15 displays the corresponding image data, and controls the individual units of the focused ion beam apparatus 10, a manipulator 17 which can pinch and hold each thin sample 1, and a storage unit 18.

Figure 3:
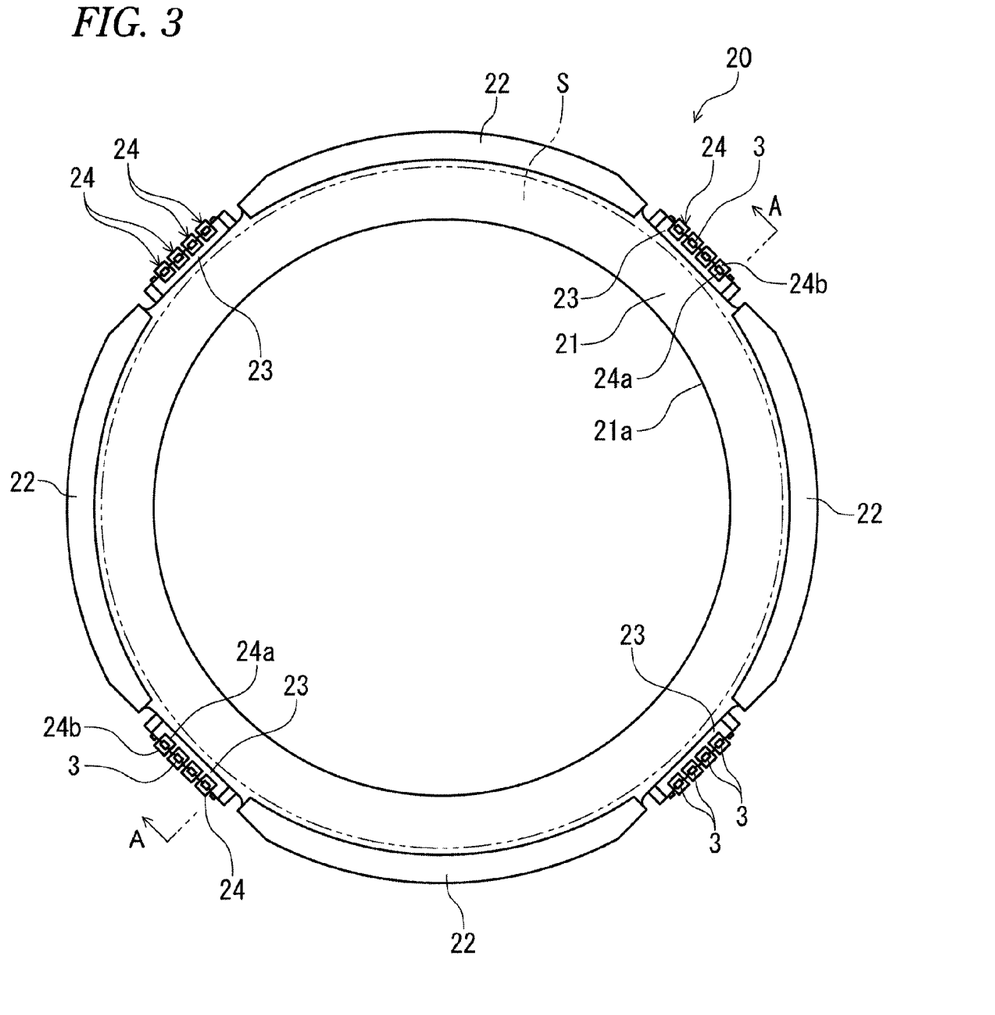
FIG. 3 is a top view illustrating a holder which is one of the components of the focused ion beam apparatus according to the embodiment and fixes a sample.
Figure 4:
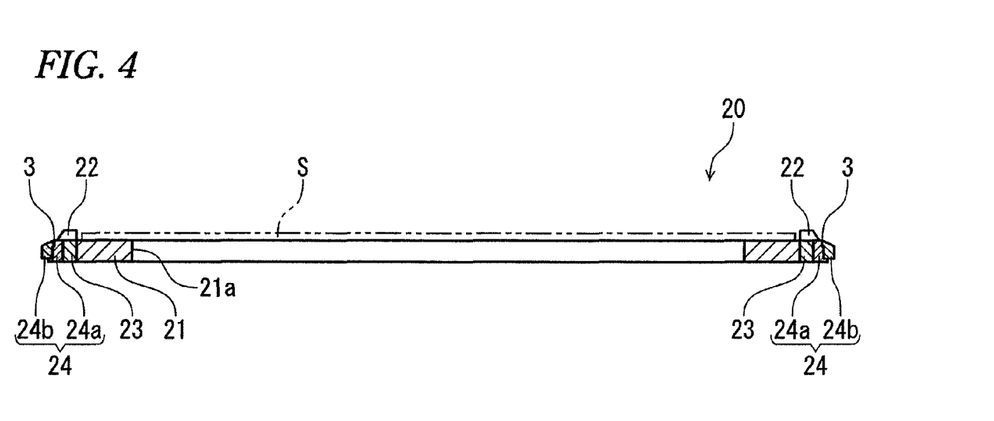
FIG. 4 is a cross-sectional view of the holder shown in FIG. 3 as taken along a line A-A.

The sample S is mounted on the stage 11 with the sample S fixed to a holder 20. As shown in FIGS. 3 and 4, the holder 20 is formed in a circular frame shape having an opening 21a at the center, and includes a main holder body 21 which has a top surface where the sample S is mounted, and guide parts 22 which abut on the outer periphery of the sample S mounted on the main holder body 21, thereby positioning the sample S on the main holder body 21. The guide parts 22 are provided at four positions on the outer periphery of the main holder body 21, for example, such that gaps are formed at regular intervals. Also, between every two guide parts 22, a sample cassette 23 configured so as to be attachable to and detachable from the main holder body 21 is disposed. Further, on the sample cassettes 23, a plurality of fixing bases 24 capable of pinching the sample holders 3 is mounted.

Figure 5:
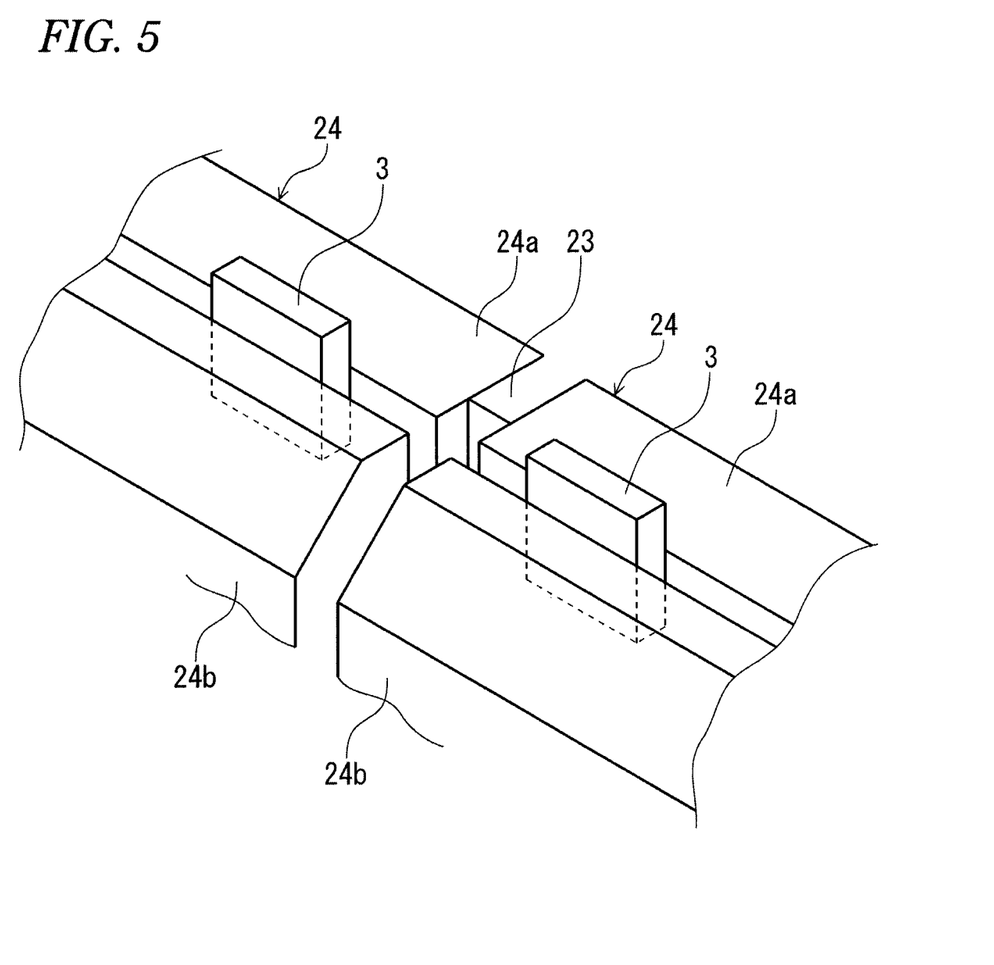
FIG. 5 is an enlarged view illustrating a part of the holder shown in FIG. 3 where sample holders are fixed.

As shown in FIG. 5, each fixing base 24 is provided with a base part 24a and a fixing part 24b which is fixed to the base part 24a by fastening of fixing screws (not shown), such that a sample holder 3 can be pinched between the base part 24a and the fixing base 24. That is, the sample holders 3 are disposed together with the sample S on the same stage 11 through the holder 20 on which the sample S is mounted.

The stage 11 is configured so as to operate according to instructions of the controller 16 and be displaced on five axes as shown in FIG. 2. That is, the stage 11 is supported by a displacement mechanism 30 that is provided with: a horizontal movement mechanism 30a that moves the holder 20 along an X axis and a Y axis which are parallel to each other in a horizontal plane and are perpendicular to each other, and along a Z axis perpendicular to the X axis and the Y axis; a tilting mechanism 30b that rotates the holder 20 around the X axis (or the Y axis) such that the holder 20 is tilted; and a rotation mechanism 30c that rotates the holder 20 around the Z axis. Therefore, the stage 11 can be displaced on the five axes by the displacement mechanism 30, whereby it is possible to irradiate a desired position with the focused ion beam FIB or the electron beam EB. By the way, the stage 11 and the displacement mechanism 30 are housed in a vacuum chamber 31. Therefore, inside the vacuum chamber 31, irradiation with the focused ion beam FIB or the electron beam EB, supply of the source gas G, and the like are performed.

The irradiation mechanism 12 is disposed above the stage 11, and is provided with a focused ion beam tube (FIB tube) 32 which irradiates the focused ion beam FIB in a vertical direction parallel to the Z axis, and an SEM tube 33 which irradiates the electron beam EB obliquely to the Z axis. The FIB tube 32 includes an ion source 32a and an ion optical system 32b, and is configured such that ions generated by the ion source 32a are narrowed by the ion optical system 32b, whereby a focused ion beam FIB is formed, and the focused ion beam FIB is irradiated toward the sample S and the sample holders 3. Also, the SEM tube 33 includes an electron source 33a and an electron optical system 33b, and is configured such that electrons generated by the electron source 33a are narrowed by the electron optical system 33b, whereby an electron beam EB is formed, and the electron beam EB is irradiated toward the sample S and the sample holders 3. Here, the FIB tube 32 and the SEM tube 33 may change places with each other such that the electron beam EB is irradiated in a vertical direction parallel to the Z axis and the focused ion beam FIB is irradiated obliquely to the Z axis. In this case, the stage 11 can be tilted by the tilting mechanism 30b, such that the surfaces of the sample S and the sample holders 3 become perpendicular to the focused ion beam FIB.

When irradiation with the focused ion beam FIB or the electron beam EB is performed, the detector 13 detects secondary charged particles E such as secondary electrons or secondary ions generated from the sample S and the sample holders 3, and outputs the detection result to the controller 16. The gas gun 14 is configured so as to supply a compound gas containing a material (such as phenanthrene, platinum, carbon, or tungsten) to be a raw material for deposition films, as a source gas G. The source gas G is decomposed by the secondary charged particles E generated by the irradiation with the focused ion beam FIB, thereby being separated into a gas component and a solid component. Then, of the two separate components, the solid component is deposited, thereby forming deposition films.

The manipulator 17 includes a driving unit 17a whose base end side is mounted on the tilting mechanism 30b, and a probe 17b which is supported on the driving unit 17a. However, in FIG. 2, in order to make it easy to see, the driving unit 17a is shown in a state where it is separate from the tilting mechanism 30b. Further, the driving unit 17a is configured so as to be able to move the probe 17b in the horizontal direction and the vertical direction and rotate the probe 17b. Therefore, it is possible to fix the probe 17b and a thin sample 1 manufactured from a sample S by deposition and freely move the thin sample 1 fixed to the probe 17b with the probe fixed thereto.

The controller 16 generally controls the above described individual components, and can change the accelerating voltage or beam current of each of the FIB tube 32 and the SEM tube 33. Especially, the controller 16 is configured to change the accelerating voltage or the amount of beam current of the FIB tube 32, thereby capable of freely adjusting the beam diameter of the focused ion beam FIB. Therefore, the controller 16 can acquire observation images and locally perform etching on the sample S. Further, during etching, it is possible to freely change the processing accuracy from rough processing to finishing by adjusting the beam diameter.

Also, if the detector 13 detects secondary charged particles E due to irradiation with the focused ion beam FIB or the electron beam EB, the controller 16 converts the secondary charged particles E into a luminance signal, thereby generating observation image data, and controls the display 15 such that the display 15 outputs an observation image based on the corresponding observation image data. In this way, the display 15 can display observation images. Also, the controller 16 is connected to an input unit 16a which can be used for an operator to perform inputting, and controls the individual components based on signals input by the input unit 16a. That is, the operator can use the input unit 16a to observe a desired area by irradiating the desired area with the focused ion beam FIB or the electron beam EB, or to perform etching on a desired area by irradiating the desired area with the focused ion beam FIB, or to forming a deposition film by irradiating a desired area with the focused ion beam FIB while supplying the source gas G to the desired area. The storage unit 18 is, for example, a hard disk or a solid state drive (SSD), and stores data to be used in the individual units of the focused ion beam apparatus 10.

Subsequently, a method of manufacturing a thin sample 1 according to the present embodiment will be described. In the present embodiment, the controller 16 stores configuration information items which an advanced-level engineer uses to manufacture a thin sample 1 (a first sample), in association with processing steps, respectively, in the storage unit 18. Thereafter, when any other engineer manufactures a thin sample 1 (a second sample), the controller 16 reads the configuration information items which the advanced-level engineer used to manufacture the thin sample 1, from the storage unit 18, and controls the individual units of the focused ion beam apparatus 10 based on the read configuration information items, thereby manufacturing the thin sample 1. Therefore, the focused ion beam apparatus 10 can manufacture thin samples 1 having uniform quality by an easier operation. Also, although a case where the first sample and the second sample are different samples will be described, the present invention can also be applied to a case where the first sample and the second sample are the same sample and different positions are processed. Also, although a case where the configuration information items of the advanced-level engineer are used by another engineer will be described, the present invention can also be applied to a case where one engineer stores configuration information items in advance and then uses the corresponding configuration information items to manufacture samples.

Each configuration information item is, for example, images of a thin sample 1 before and after processing, a value representing the set position of a processing frame indicating a predetermined processing area to be processed by the focused ion beam FIB, a value representing a processing condition, or a value representing an observation condition. A value representing the set position of a processing frame is a value representing a relative distance from the edge of a cross-section surface of a thin sample 1 to a side of a processing frame on the cross-section surface side. A value representing a processing condition is, for example, the beam condition (the accelerating voltage and the beam current) of the focused ion beam FIB, process settings (a scan direction, a scan mode, a beam irradiation interval, and a depth setting (a dose amount), a sample stage tilt angle, and a visual field size during processing). Also, a value representing an observation condition is, for example, an SEM observation condition for determining a processing end point (an accelerating voltage, a current, a scan speed, a scan mode, an integration method (frame integration or dot integration), selection of the detector 13 or a detector contained in the SEM tube 33, and contrast/brightness settings. Also, each configuration information item is not limited to the above described values, and may be any other information item as long as the corresponding item is used to manufacture thin samples 1.

Figure 6:
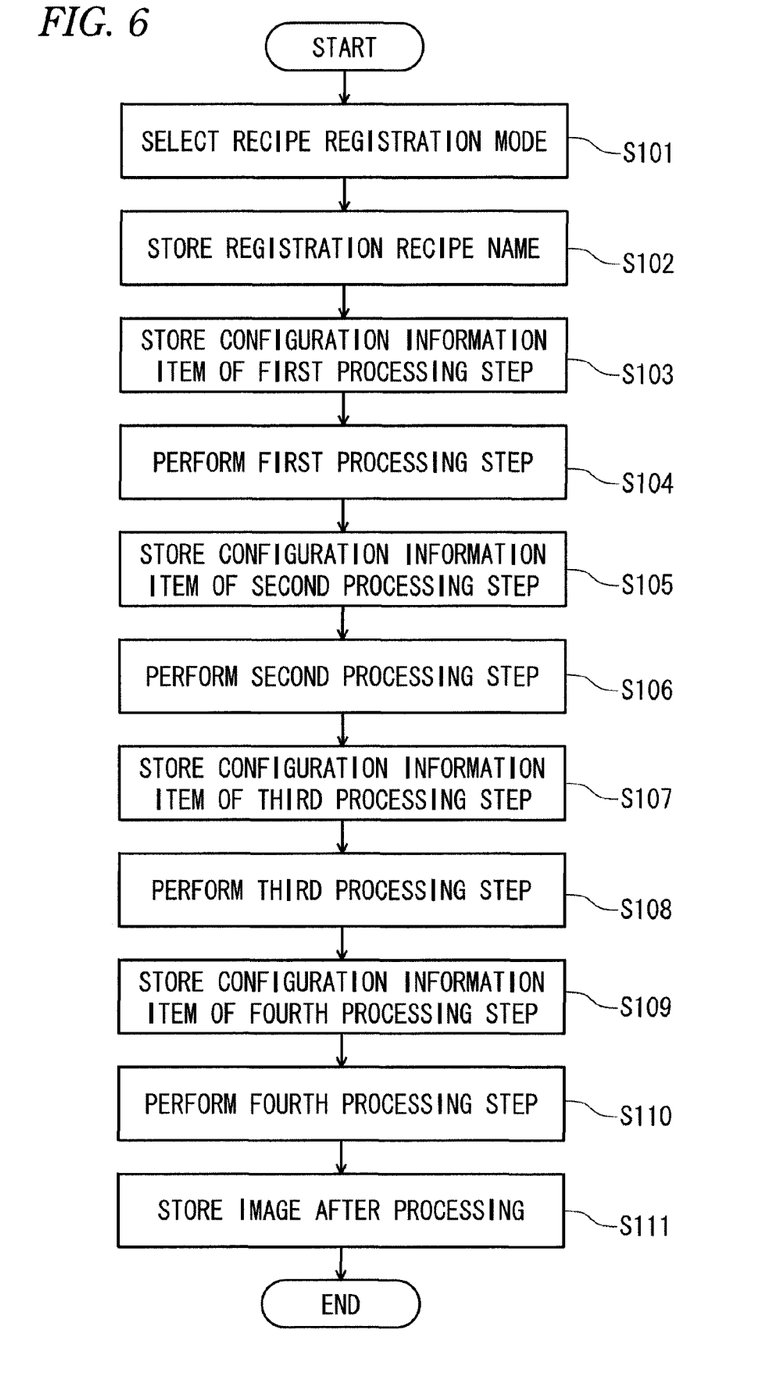
FIG. 6 is a flow chart illustrating a configuration information registering process according to the embodiment.

Subsequently, a configuration information registering process of the controller 16 to store configuration information items when an advanced-level engineer inputs to manufacture a thin sample 1, in association with individual processing steps, respectively, in the storage unit 18 will be described. FIG. 6 is a flow chart illustrating the configuration information registering process of storing configuration information items when an advanced-level engineer inputs to manufacture a thin sample 1, in association with individual processing steps, respectively, in the storage unit 18 in the present embodiment. Hereinafter, a description will be made using an example in which four steps of first to fourth processing steps are performed to manufacture a thin sample 1. Also, although a description of the present embodiment will be made using an example in which four steps of first to fourth processing steps are performed to manufacture a thin sample 1, the present invention is not limited thereto. Any number of processing steps can be used. For example, three or less processing steps may be performed to manufacture a thin sample 1, or five or more processing steps may be performed to manufacture a thin sample 1.

In STEP S101, the controller 16 controls the display 15 such that the display 15 displays a screen for receiving an input of a recipe registration mode or a recipe read mode. In a case of storing configuration information items, the operator selects the recipe registration mode by operating the input unit 16a. In a case of determining that the input unit 16a has received an input for selecting the recipe registration mode, the controller 16 proceeds to the process of STEP S102. Meanwhile, in a case of determining that the input unit 16a has received an input for selecting the recipe read mode, the controller 16 performs a sample manufacturing process to be described below.

In STEP S102, the controller 16 controls the display 15 such that the display 15 displays a screen for receiving an input of the name of a recipe to be registered. The operator inputs the name of a recipe to be registered by operating the input unit 16a. Then, the controller 16 stores the recipe name which the input unit 16a has received as an input, as a registration recipe name in the storage unit 18. Thereafter, the controller 16 proceeds to the process of STEP S103.

In STEP S103, the controller 16 controls the individual units of the focused ion beam apparatus 10, thereby acquiring an image of a thin sample 1 before processing. Also, the controller 16 controls the display 15 such that the display 15 displays a screen for receiving an input of a configuration information item to be used in the processing of the first processing step. Then, the operator inputs a configuration information item to be used in the processing of the first processing step by operating the input unit 16a. The controller 16 stores the configuration information item which the input unit 16a has received as an input, and the image of the thin sample 1 before processing, as the configuration information item of the first processing step, in association with the registration recipe name stored in the process of STEP S102, in the storage unit 18. Thereafter, the controller 16 proceeds to the process of STEP S104.

In STEP S104, the controller 16 controls the individual units of the focused ion beam apparatus 10, thereby performing processing (the first processing step) on the thin sample 1 based on the configuration information item which the input unit 16a has received as an input in the process of STEP S103. Thereafter, the controller 16 proceeds to the process of STEP S105.

In STEP S105, the controller 16 controls the individual units of the focused ion beam apparatus 10, thereby acquiring an image of the thin sample 1 subjected to the processing of the first processing step. Also, the controller 16 controls the display 15 such that the display 15 displays a screen for receiving an input of a configuration information item to be used in the processing of the second processing step. Then, the operator inputs a configuration information item to be used in the processing of the second processing step by operating the input unit 16a. The controller 16 stores the configuration information item which the input unit 16a has received as an input, and the image of the thin sample 1 subjected to the processing of the first processing step, as the configuration information item of the second processing step, in association with the registration recipe name stored in the process of STEP S102, in the storage unit 18. Thereafter, the controller 16 proceeds to the process of STEP S106.

In STEP S106, the controller 16 controls the individual units of the focused ion beam apparatus 10, thereby performing processing (the second processing step) on the thin sample 1 based on the configuration information item which the input unit 16a has received as an input in the process of STEP S105. Thereafter, the controller 16 proceeds to the process of STEP S107.

In STEP S107, the controller 16 controls the individual units of the focused ion beam apparatus 10, thereby acquiring an image of the thin sample 1 subjected to the processing of the second processing step. Also, the controller 16 controls the display 15 such that the display 15 displays a screen for receiving an input of a configuration information item to be used in the processing of the third processing step. Then, the operator inputs a configuration information item to be used in the processing of the third processing step by operating the input unit 16*a*. The controller 16 stores the configuration information item which the input unit 16*a* has received as an input, and the image of the thin sample 1 subjected to the processing of the second processing step, as the configuration information item of the third processing step, in association with the registration recipe name stored in the process of STEP S102, in the storage unit 18. Thereafter, the controller 16 proceeds to the process of STEP S108.

In STEP S108, the controller 16 controls the individual units of the focused ion beam apparatus 10, thereby performing processing (the third processing step) on the thin sample 1 based on the configuration information item which the input unit 16*a* has received as an input in the process of STEP S107. Thereafter, the controller 16 proceeds to the process of STEP S109.

In STEP S109, the controller 16 controls the individual units of the focused ion beam apparatus 10, thereby acquiring an image of the thin sample 1 subjected to the processing of the third processing step. Also, the controller 16 controls the display 15 such that the display 15 displays a screen for receiving an input of a configuration information item to be used in the processing of the fourth processing step. Then, the operator inputs a configuration information item to be used in the processing of the fourth processing step by operating the input unit 16*a*. The controller 16 stores the configuration information item which the input unit 16*a* has received as an input, and the image of the thin sample 1 subjected to the processing of the third processing step, as the configuration information item of the fourth processing step, in association with the registration recipe name stored in the process of STEP S102, in the storage unit 18. Thereafter, the controller 16 proceeds to the process of STEP S110.

In STEP S110, the controller 16 controls the individual units of the focused ion beam apparatus 10, thereby performing processing (the fourth processing step) on the thin sample 1 based on the configuration information item which the input unit 16*a* has received as an input in the process of STEP S109. Thereafter, the controller 16 proceeds to the process of STEP S111.

In STEP S111, the controller 16 controls the individual units of the focused ion beam apparatus 10, thereby acquiring an image of the thin sample 1 subjected to the processing of the fourth processing step. Also, the controller 16 stores the image of the thin sample 1 subjected to the processing of the fourth processing step, as a thin-sample image after processing, in association with the registration recipe name stored in the process of STEP S102, in the storage unit 18. Thereafter, the controller 16 finishes the configuration information registering process.

According to the above described configuration information registering process, it is possible to store individual configuration information items which the advanced-level engineer inputs to manufacture a thin sample 1, in association with the individual processing steps, respectively, in the storage unit 18. For example, the first processing step is a step of performing rough processing by the focused ion beam FIB at an accelerating voltage of 30 kV and a beam current of 120 pA until the thickness of the thin sample becomes 150 nm. The second processing step is a step of performing intermediate processing by the focused ion beam FIB at an accelerating voltage of 30 kV and a beam current of 80 pA until the thickness of the thin sample becomes 80 nm. The third processing step is a step of performing intermediate processing by the focused ion beam FIB at an accelerating voltage of 5 kV and a beam current of 40 pA until the thickness of the thin sample becomes 30 nm. The fourth processing step is a step of performing finishing by the focused ion beam FIB at an accelerating voltage of 2 kV and a beam current of 20 pA until the thickness of the thin sample becomes 20 nm.

Figure 7:
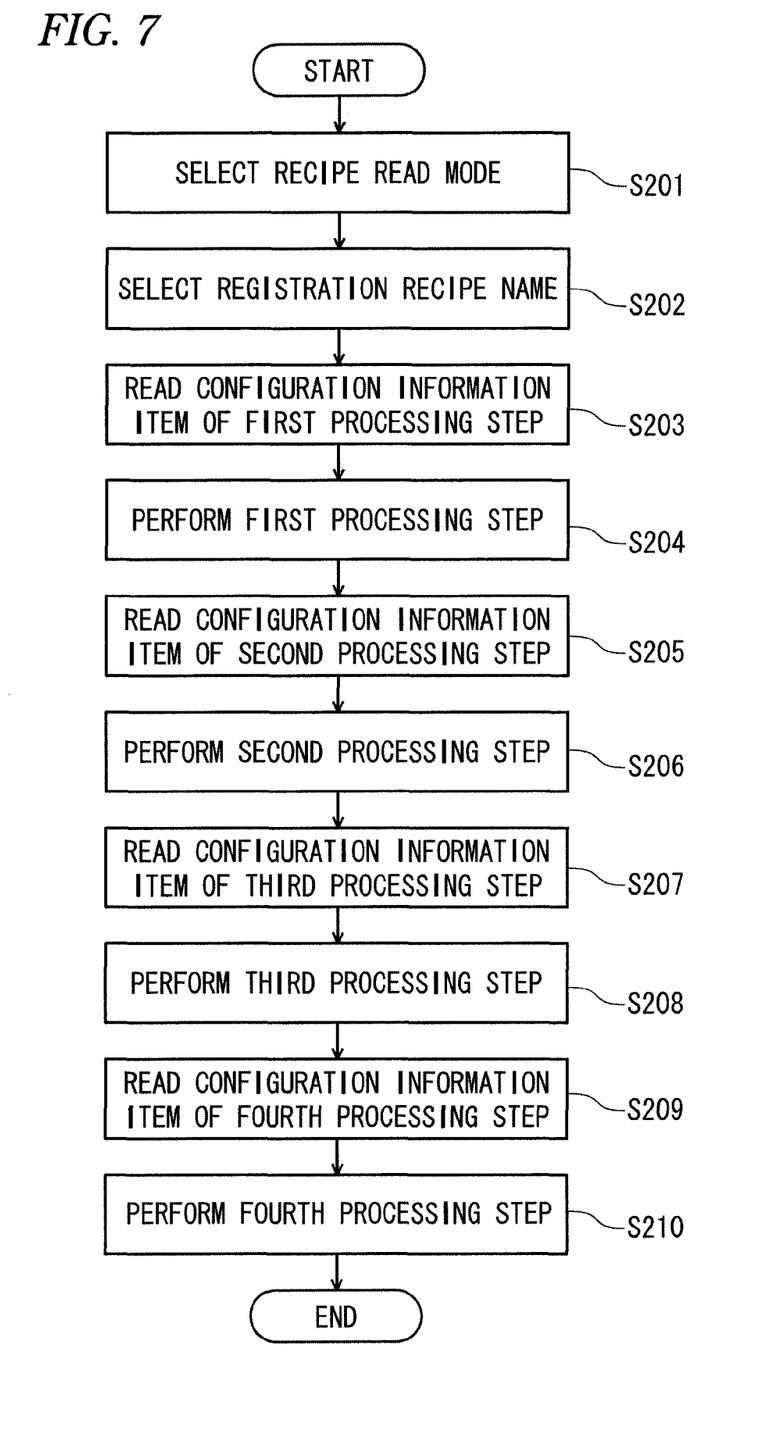
FIG. 7 is a flow chart illustrating a sample manufacturing process according to the embodiment.

Subsequently, a sample manufacturing process of the focused ion beam apparatus 10 to manufacture a thin sample 1 based on individual configuration information items which an advanced-level engineer has used to manufacture a thin sample 1 will be described. FIG. 7 is a flow chart illustrating a sample manufacturing process of the focused ion beam apparatus 10 to manufacture a thin sample 1 based on individual configuration information items which an advanced-level engineer has used to manufacture a thin sample 1 in the present embodiment.

In STEP S201, the controller 16 controls the display 15 such that the display 15 displays a screen for receiving an input of the recipe registration mode or the recipe read mode. In a case of manufacturing a thin sample 1 based on configuration information items, the operator selects the recipe read mode by operating the input unit 16*a*. In a case of determining that the input unit 16*a* has received an input for selecting the recipe read mode, the controller 16 proceeds to the process of STEP S202. Meanwhile, in a case of determining that the input unit 16*a* has received an input for selecting the recipe registration mode, the controller 16 performs the configuration information registering process described above.

In STEP S202, the controller 16 controls the display 15 such that the display 15 displays a screen for receiving a selection input of a registration recipe name stored in the storage unit 18. The operator selects a registration recipe name to be used to manufacture a thin sample 1 by operating the input unit 16*a*. The controller 16 reads configuration information items associated with the registration recipe name which the input unit 16*a* has received as a selection input. Thereafter, the controller 16 proceeds to the process of STEP S203.

In STEP S203, the controller 16 sets the configuration information item of the first processing step among the configuration information items read in the process of STEP S202, in the individual units of the focused ion beam apparatus 10. Also, the operator may be able to change the configuration information item. Thereafter, the controller 16 proceeds to the process of STEP S204.

In STEP S204, the controller 16 controls the individual units of the focused ion beam apparatus 10, thereby performing processing (the first processing step) on the thin sample 1 based on the configuration information item of the first processing step set in the process of STEP S203. Also, in a case where the operator has changed the configuration information item in the process of STEP S203, the controller 16 performs the processing on the thin sample 1 based on the configuration information item changed by the operator. Subsequently, the controller 16 controls the individual units of the focused ion beam apparatus 10, thereby acquiring an image of the thin sample 1 subjected to the processing of the first processing step. Thereafter, the controller 16 proceeds to the process of STEP S205.

In STEP S205, the controller 16 sets the configuration information item of the second processing step among the configuration information items read in the process of STEP S202, in the individual units of the focused ion beam apparatus 10. Also, the operator may be able to change the configuration information item. Thereafter, the controller 16 proceeds to the process of STEP S206.

In STEP S206, the controller 16 controls the individual units of the focused ion beam apparatus 10, thereby performing processing (the second processing step) on the thin sample 1 based on the configuration information item of the second processing step set in the process of STEP S205. Also, in a case where the operator has changed the configuration information item in the process of STEP S205, the controller 16 performs the processing on the thin sample 1 based on the configuration information item changed by the operator. Subsequently, the controller 16 controls the individual units of the focused ion beam apparatus 10, thereby acquiring an image of the thin sample 1 subjected to the processing of the second processing step. Thereafter, the controller 16 proceeds to the process of STEP S207.

In STEP S207, the controller 16 sets the configuration information item of the third processing step among the configuration information items read in the process of STEP S202, in the individual units of the focused ion beam apparatus 10. Also, the operator may be able to change the configuration information item. Thereafter, the controller 16 proceeds to the process of STEP S208.

In STEP S208, the controller 16 controls the individual units of the focused ion beam apparatus 10, thereby performing processing (the third processing step) on the thin sample 1 based on the configuration information item of the third processing step set in the process of STEP S207. Also, in a case where the operator has changed the configuration information item in the process of STEP S207, the controller 16 performs the processing on the thin sample 1 based on the configuration information item changed by the operator. Subsequently, the controller 16 controls the individual units of the focused ion beam apparatus 10, thereby acquiring an image of the thin sample 1 subjected to the processing of the third processing step. Thereafter, the controller 16 proceeds to the process of STEP S209.

In STEP S209, the controller 16 sets the configuration information item of the fourth processing step among the configuration information items read in the process of STEP S202, in the individual units of the focused ion beam apparatus 10. Also, the operator may be able to change the configuration information item. Thereafter, the controller 16 proceeds to the process of STEP S210.

In STEP S210, the controller 16 controls the individual units of the focused ion beam apparatus 10, thereby performing processing (the fourth processing step) on the thin sample 1 based on the configuration information item of the fourth processing step set in the process of STEP S209. Also, in a case where the operator has changed the configuration information item in the process of STEP S209, the controller 16 performs the processing on the thin sample 1 based on the configuration information item changed by the operator. Subsequently, the controller 16 controls the individual units of the focused ion beam apparatus 10, thereby acquiring an image of the thin sample 1 subjected to the processing of the fourth processing step. Thereafter, the controller 16 finishes the sample manufacturing process.

According to the sample manufacturing process described above, the controller 16 can read configuration information items which an advanced-level engineer used to manufacture a thin sample 1, from the storage unit 18, and control the individual units of the focused ion beam apparatus 10 based on the read configuration information items, thereby manufacturing a thin sample 1.

Figure 8:
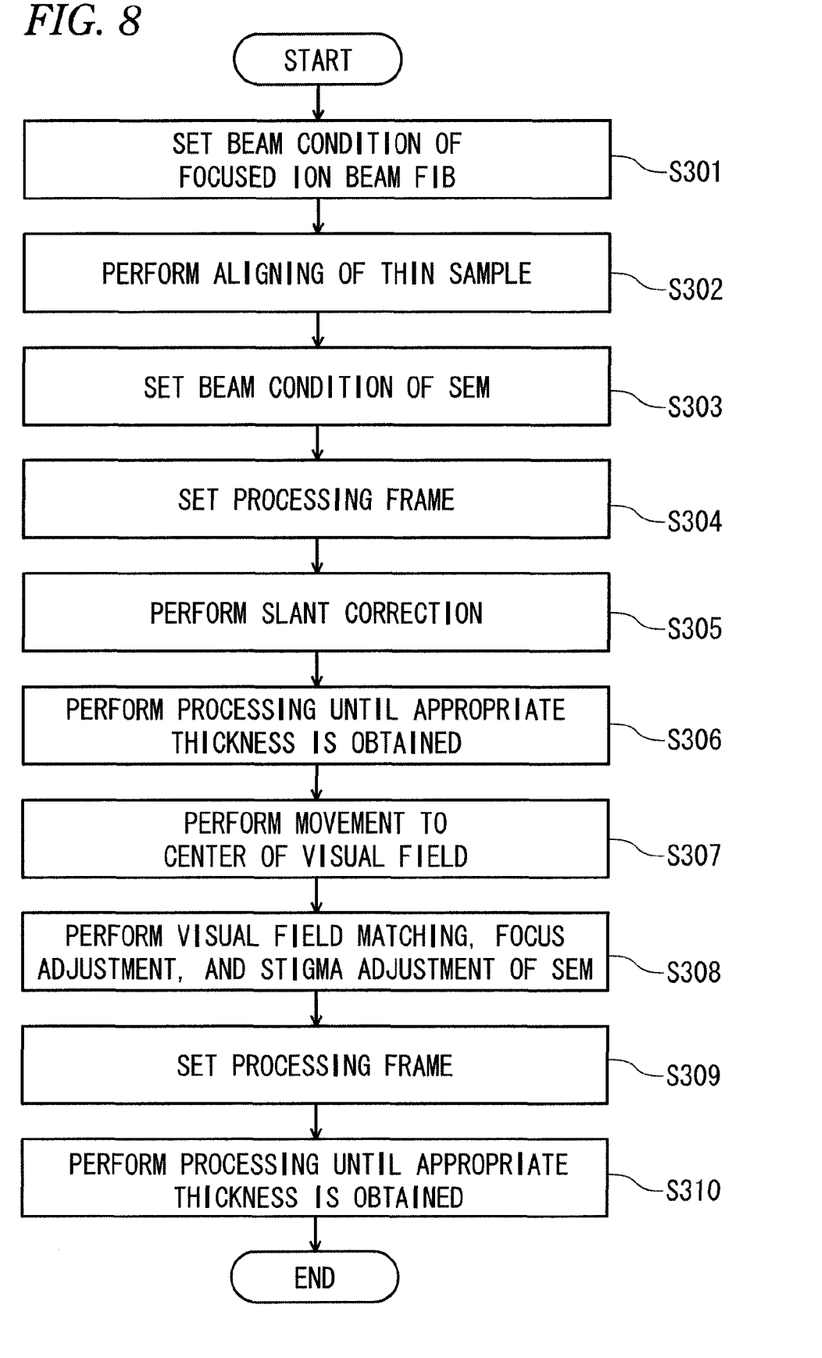
FIG. 8 is a flow chart illustrating examples of processes of each processing step according to the embodiment.

Subsequently, examples of processes of each processing step will be described. FIG. 8 is a flow chart illustrating an example of the procedure of the processes of each processing step according to the present embodiment. Also, the processing contents of the first to fourth processing steps are identical except for the configuration information items. In general, a beam current or a voltage for processing depends on the thickness of a processing area of a thin sample 1; however, the processing contents are identical.

Also, with respect to settings of each step, in the recipe registration mode, the controller 16 controls the storage unit 18 such that the storage unit 18 stores a value set by an advanced-level engineer. Further, in the recipe read mode, the controller 16 reads the value from the storage unit 18, and sets the value.

In STEP S301, a beam condition of the focused ion beam FIB is selected. Thereafter, the controller 16 proceeds to the process of STEP S302.

In STEP S302, aligning of a thin sample 1 ("Front") is performed. Here, a cross-section surface on the SEM tube (33) side is referred to as a "Front", and a cross-section surface on the opposite side to the SEM tube (33) side is referred to as a "Back". For example, the position of the "Front" is moved to the center of the visual field by moving the stage, whereby correction on a deviation of a cross-section surface in the rotation direction due to rotation of the stage, that is, slant matching is performed. Also, in a case where fine adjustment has been performed, the position of the "Front" is automatically updated. Thereafter, the controller 16 proceeds to the process of STEP S303.

In STEP S303, a beam condition of the SEM is selected. For example, visual field matching, focus adjustment, and stigma adjustment are performed. Thereafter, the controller 16 proceeds to the process of STEP S304.

In STEP S304, a processing frame is set. Thereafter, the controller 16 proceeds to the process of STEP S305.

In STEP S305, SEM observation is performed while processing is performed, and according to a variation in the cross-section surface pattern, slant correction is performed by rotation of the stage. Thereafter, the controller 16 proceeds to the process of STEP S306.

Figure 9A:
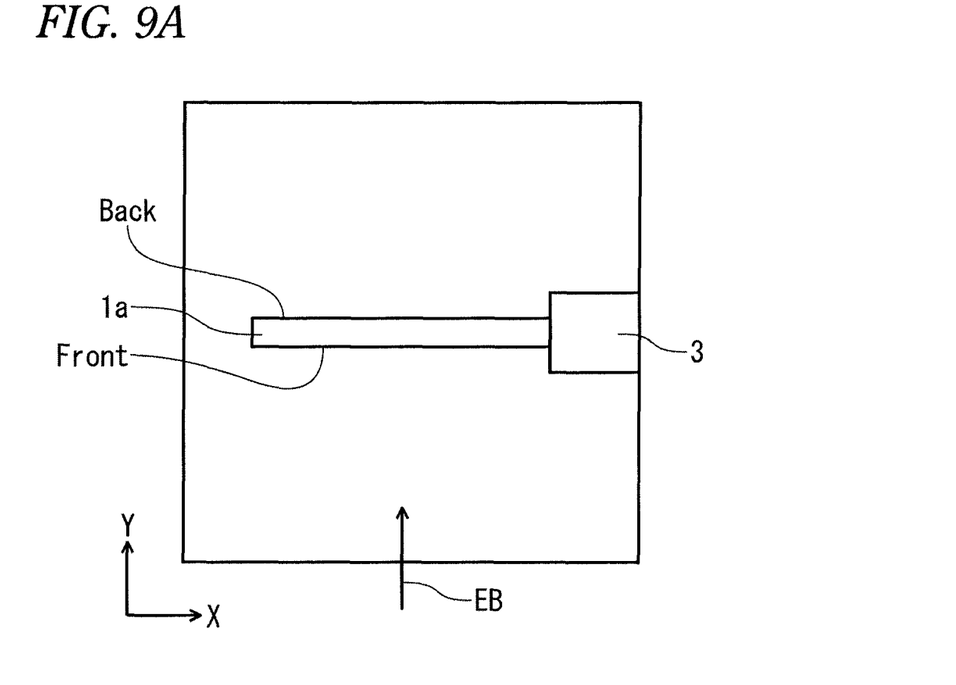
FIGS. 9A and 9B are views illustrating an observation image formed by irradiating a surface 1a of a thin sample 1 with a focused ion beam FIB from a vertical direction, and an observation image formed by irradiating a cross-section surface 1b of the thin sample 1.
Figure 9B:
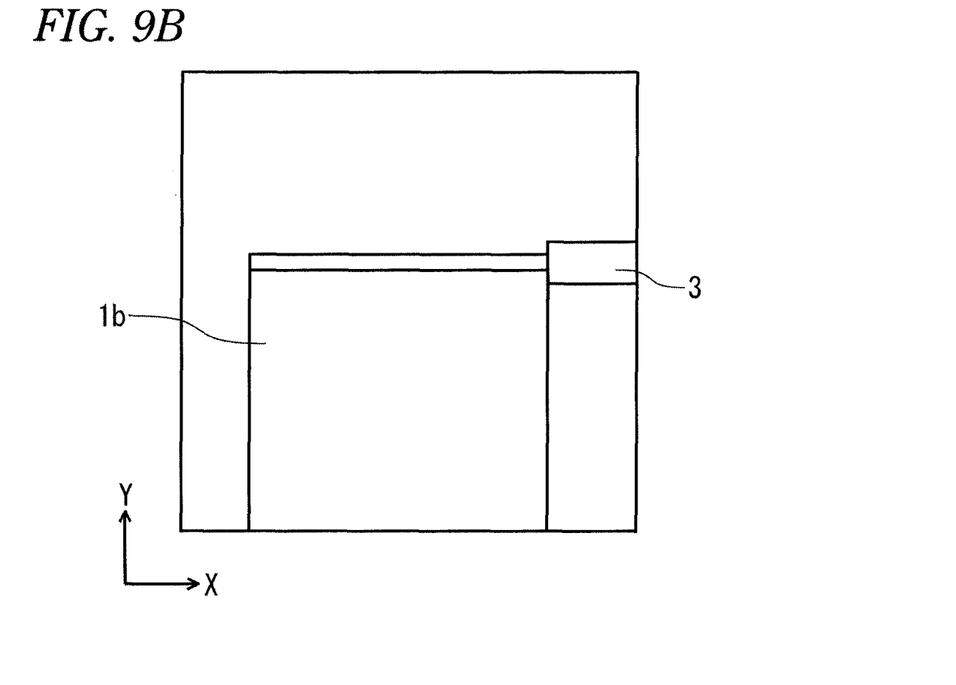

In STEP S306, processing is performed until an appropriate thickness is obtained. For example, the thickness is determined by an SIM image of the surface of the thin sample and an SEM image of the cross-section surface. That is, the thickness is determined from an observation image formed by irradiating the surface 1a of the thin sample 1 with the focused ion beam FIB from the vertical direction as shown in FIG. 9A, and an observation image formed by scanning the cross-section surface 1b of the thin sample 1 with the electron beam EB as shown in FIG. 9B. Also, the X and Y directions shown in FIG. 9A or 9B represent the X and Y directions of the coordinate system of the corresponding observation image. Also, SEM images after the processing are saved. Thereafter, the controller 16 proceeds to the process of STEP S307.

In STEP S307, the stage is rotated 180 degrees such that the "Back" faces the SEM tube 33 side, and then is moved to the center of the visual field. Thereafter, the controller 16 proceeds to the process of STEP S308.

In STEP S308, visual field matching, focus adjustment, and stigma adjustment of the SEM are performed. Thereafter, the controller 16 proceeds to the process of STEP S309.

In STEP S309, a processing frame is set. Thereafter, the controller 16 proceeds to the process of STEP S310.

In STEP S310, processing is performed until an appropriate thickness is obtained. Also, SEM images after the processing are saved. Thereafter, the controller 16 finishes the corresponding processing step.

Figure 10:
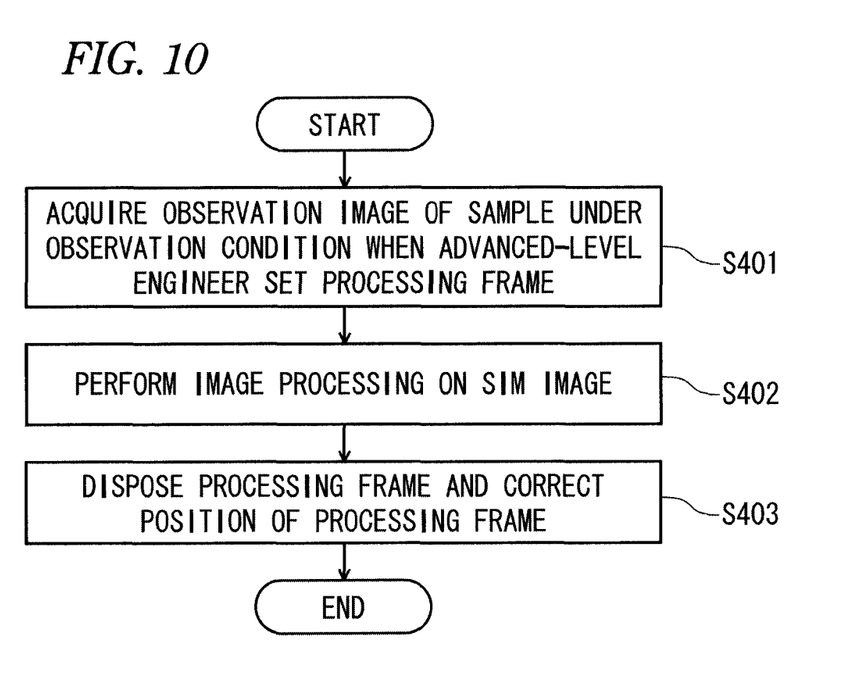
FIG. 10 is a flow chart illustrating an example of a processing-frame setting process in a recipe read mode according to the embodiment.

The processes of the individual steps described above can be repeated, whereby it is possible to manufacture a thin sample 1. Also, setting of a processing frame in the process of each of STEPS S304 and S309 in the recipe read mode is performed, for example, in the following procedure. FIG. 10 is a flow chart illustrating an example of the procedure of a processing-frame setting process in the recipe read mode in the present embodiment.

In STEP S401, the controller 16 acquires an observation image of a sample under an observation condition in a case where an advanced-level engineer registered in the recipe registration mode has set a processing frame. Here, as for the observation condition, it is important to use a condition registered with respect to a visual field size which influences the accuracy of the processing-frame setting position and image processing, and image brightness. Thereafter, the controller 16 proceeds to the process of STEP S402.

In STEP S402, in order to facilitate edge recognition, a deconvolution process or image processing such as edge enhancement is performed on the acquired SIM image. Thereafter, the controller 16 proceeds to the process of STEP S403. Especially, in a case where the accelerating voltage is low or the amount of beam current is large, since the beam diameter is large, image recognition of the edge position of a cross-section surface which becomes a reference to set the position of the processing frame becomes difficult. For example, during finishing, the beam diameter becomes larger than the thickness of the thin sample. In this case, since it is possible to accurately recognize a cross-section surface position in an observation image by image processing, it is possible to set the processing frame at an accurate position.

Figure 11A:
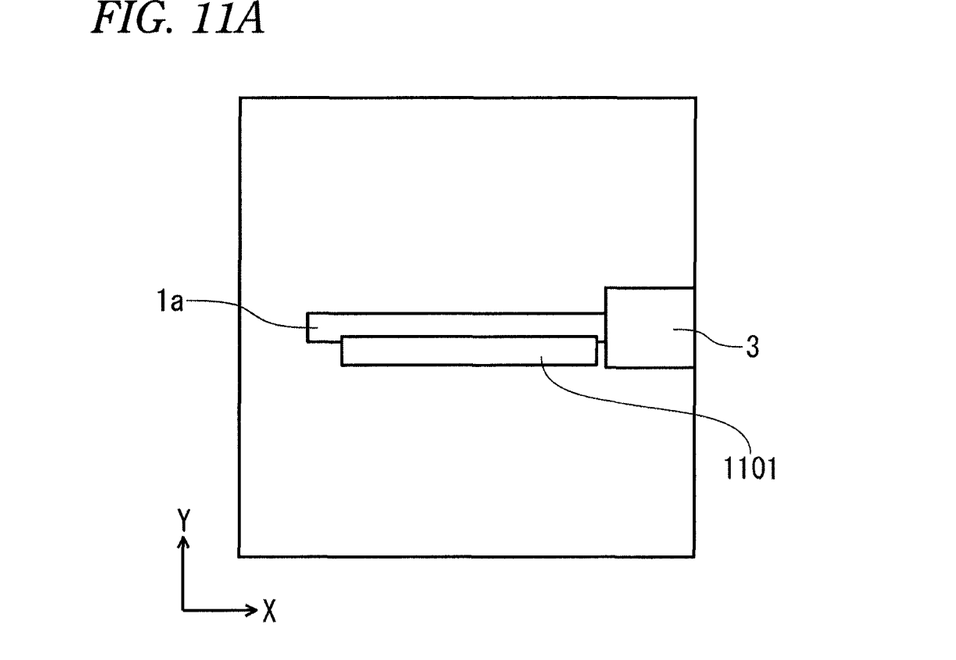
FIGS. 11A and 11B are views illustrating positions which the processing frame is disposed according to the embodiment.
Figure 11B:
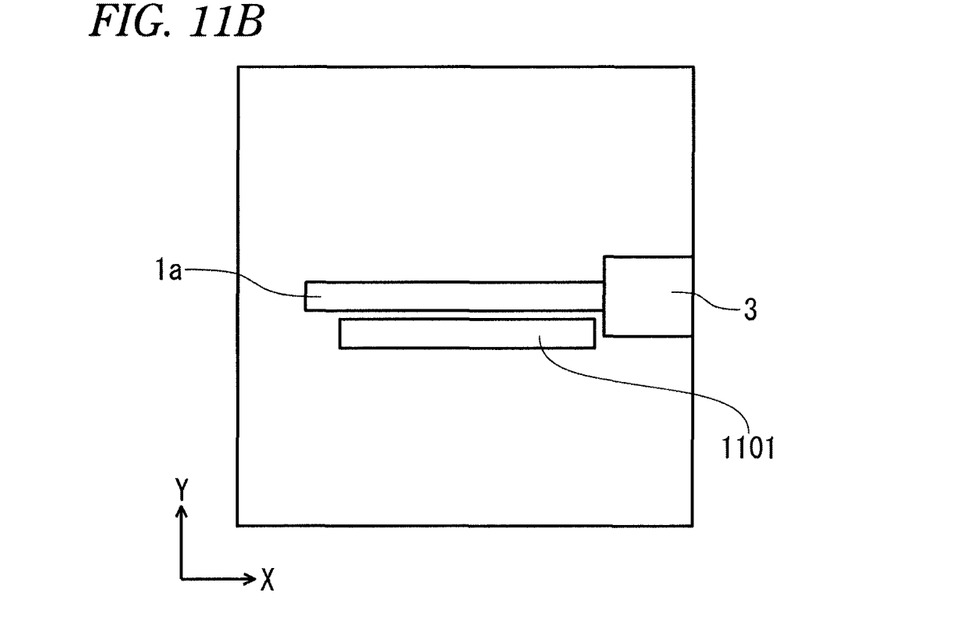

In STEP S403, the operator disposes the processing frame at a position to process the cross-section surface of the image subjected to the above described processing. Thereafter, the position of the processing frame disposed by the operator is corrected reflecting the positional relation between the processing frame and the edge of the cross-section surface saved in a recipe is reflected, with reference to the edge position of the cross-section surface of the corresponding image. Here, the positional relation between the edge of the cross-section surface and the processing frame is the relative position between the edge of the cross-section surface and the processing frame, and is a distance between the edge of the cross-section surface and the processing frame on the image. That is, first, the operator disposes a processing frame 1101 at a position to perform processing on the surface 1a of the thin sample 1 as shown in FIG. 11A. Next, based on recipe information and an observation image, the controller 16 corrects the position of the processing frame 1101 as shown in FIG. 11B. Especially, in a case where the accelerating voltage is low or the amount of beam current is large, since the beam diameter becomes large, a range wider than the processing frame is irradiated with a beam. If the processing frame 1101 is set so as to extend over the surface 1a of the thin sample 1 in the observation image as shown in FIG. 11A, and processing is performed, actually, a range wider than the processing frame is irradiated with a beam, whereby a wide range of the thin sample is subjected to etching. For this reason, the controller 16 corrects the position of the processing frame 1101 such that the processing frame goes away from the thin sample 1 as shown in FIG. 11B. As a result, it is possible to accurately process the cross-section surface. Here, correction on the position of the processing frame may be performed only in the Y direction. The reason is that the positional relation between the cross-section surface 1b and the boundary line of the processing frame on the cross-section surface is especially important. If the boundary line is excessively close to the cross-section surface, the thin sample is excessively shaved, and if the boundary line is excessively far from the cross-section surface, it is impossible to perform finishing to a desired thickness. Thereafter, the process is finished.

Also, in a case where the processing condition or the like has been instantaneously changed during processing, if a processing-frame set scan instruction is input to the input unit 16a (for example, a processing-frame set scan button is clicked), the edge position of the processing frame displayed at that moment is automatically recognized and set to a position registered in the recipe. Also, in a case of performing fine adjustment, the operator performs the adjustment in units of pixels by operating the input unit 16a (for example, by operating arrow buttons provided as a physical button in the input unit 16a or displayed in a display screen in a wizard dialog box or in a sub-window).

As described above, according to the present embodiment, the controller 16 stores configuration information items which an advanced-level engineer uses to manufacture a thin sample 1, in association with processing steps, respectively, in the storage unit 18. Thereafter, when any other engineer manufactures a thin sample 1, the controller 16 reads the configuration information items which the advanced-level engineer used to manufacture the thin sample 1, from the storage unit 18, and controls the individual units of the focused ion beam apparatus 10 based on the read configuration information items, thereby manufacturing the thin sample 1. Therefore, the focused ion beam apparatus 10 can manufacture thin samples 1 having uniform quality by an easier operation.

Also, all or some of the functions of the units of the focused ion beam apparatus 10 in the above described embodiment may be realized by recording a program for realizing those functions in a computer-readable recording medium and causing a computer system to read the program recorded in the recording medium and execute the program. The term "computer system" mentioned here includes an OS and hardware such as peripheral devices.

Also, the term "computer-readable recording medium" means a storage unit, for example, a portable medium such as a flexible disk, a magneto-optical disc, a ROM, or a CD-ROM, or a hard disk included inside a computer system. Further, the term "computer-readable recording medium" may include one that retains a program dynamically for a short time, like a communication line in a case of transmitting the program via a network such as the Internet or communication lines such as telephone lines, and one that retains a program for a given time, like a volatile memory included a computer system serving as a server or a client in that case. Also, the foregoing program may be a program for realizing some of the above-described functions or may be a program for realizing the above-described functions in combination with a program already recorded in a computer system.

Although the embodiment of the present invention has been described above in detail with reference to the drawings, specific configurations are not limited to the embodiment and designs and so on without departing from the spirit or scope of this invention are included.

What is claimed is:
1. A focused ion beam apparatus comprising:
a focused ion beam tube configured to irradiate a focused ion beam onto a sample;
a detector configured to detect secondary particles generated from the sample due to the irradiation with the focused ion beam and to output detection information regarding detected secondary particles;

an image forming unit configured to form an observation image of the sample based on the detection information;

a storage unit configured to store positional relation between a first processing area set on an observation image of a first sample and a cross-section surface of the first sample; and a processing area setting unit configured to automatically set a second processing area on an observation image of a second sample based on the positional relation stored in the storage unit and a position of a cross-section surface of the second sample on the observation image of the second sample.

2. The focused ion beam apparatus according to claim 1 further comprising:

an image processing unit configured to perform an edge enhancement process or a deconvolution process on the observation image of the cross-section surface of the second sample.

3. The focused ion beam apparatus according to claim 1, wherein the image forming unit is configured to form the observation image of the second sample under an observation condition of the observation image of the first sample.

4. The focused ion beam apparatus according to claim 1, wherein the cross-section surface is one of cross-section surfaces of a thin sample.

5. The focused ion beam apparatus according to claim 4, wherein the focused ion beam tube is configured to irradiate the focused ion beam to form the observation image of the second sample with a beam diameter that is larger than a thickness of the thin sample.

6. The focused ion beam apparatus according to claim 4, wherein the storage unit is configured to store the positional relation corresponding to each of the one of the cross-section surfaces of the thin sample and another one of the cross-section surfaces facing the one of the cross-section surfaces.

* * * * *